(12) United States Patent
Boehm et al.

(10) Patent No.: US 9,476,947 B2
(45) Date of Patent: Oct. 25, 2016

(54) METHOD FOR ASCERTAINING OPERATING PARAMETERS OF A BATTERY, BATTERY MANAGEMENT SYSTEM, AND BATTERY

(75) Inventors: Andre Boehm, Kornwestheim (DE); Christoph Brochhaus, Aachen (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 604 days.

(21) Appl. No.: 13/992,733

(22) PCT Filed: Oct. 14, 2011

(86) PCT No.: PCT/EP2011/067948
§ 371 (c)(1),
(2), (4) Date: Aug. 24, 2013

(87) PCT Pub. No.: WO2012/076220
PCT Pub. Date: Jun. 14, 2012

(65) Prior Publication Data
US 2014/0302355 A1    Oct. 9, 2014

(30) Foreign Application Priority Data
Dec. 10, 2010   (DE) ................. 10 2010 062 856

(51) Int. Cl.
*H01M 10/48*     (2006.01)
*H01M 10/0525*   (2010.01)
(Continued)

(52) U.S. Cl.
CPC ........ *G01R 31/3606* (2013.01); *B60L 3/0046* (2013.01); *G01R 31/3651* (2013.01);
(Continued)

(58) Field of Classification Search
CPC ........... H01M 10/486; H01M 10/482; H01M 10/48; H01M 10/0525; B60L 3/0046; B60L 11/14; B60L 11/18; G01R 31/3606; G01R 31/3651
See application file for complete search history.

(56) References Cited

U.S. PATENT DOCUMENTS

2008/0150490 A1*  6/2008  Koziara ............... B60L 3/0046
                                                    320/137
2009/0027056 A1*  1/2009  Huang ................ B60L 11/1857
                                                    324/439
(Continued)

FOREIGN PATENT DOCUMENTS

CN    101187697 A     5/2008
DE    602 03 171 T2  12/2005
EP    1 933 159 A2    6/2008

OTHER PUBLICATIONS

International Search Report corresponding to PCT Application No. PCT/EP2011/067948, mailed Dec. 23, 2011 (German and English language document) (7 pages).

*Primary Examiner* — Kenneth Douyette
(74) *Attorney, Agent, or Firm* — Maginot Moore & Beck LLP

(57) ABSTRACT

The disclosure relates to a method for ascertaining permissible operating parameters of a battery. For this purpose, operating parameters of the battery are measured, and further relevant operating parameters of the battery are determined from the measured operating parameters. Furthermore, at least one of the determined operating parameters is compared with a predefined comparison range. If the at least one operating parameter lies within the predefined comparison range, the permissible operating range of the at least one operating parameter is determined using a mathematical model of the battery. However, if the at least one battery parameter lies outside the predefined comparison range, the permissible operating range of the at least one operating parameter is determined using previously stored battery data.

7 Claims, 4 Drawing Sheets

(51) Int. Cl.
 *G01R 31/36* (2006.01)
 *B60L 3/00* (2006.01)

(52) U.S. Cl.
 CPC ......... *H01M10/48* (2013.01); *H01M 10/0525* (2013.01); *H01M 2220/20* (2013.01); *Y02T 10/7011* (2013.01)

(56) References Cited

U.S. PATENT DOCUMENTS

2009/0265125 A1\* 10/2009 Zhang ................. H01M 10/482
 702/63
2010/0185405 A1 7/2010 Aoshima et al.

\* cited by examiner

METHOD FOR ASCERTAINING OPERATING PARAMETERS OF A BATTERY, BATTERY MANAGEMENT SYSTEM, AND BATTERY

This application is a 35 U.S.C. §371 National Stage Application of PCT/EP2011/067948, filed on Oct. 14, 2011, which claims the benefit of priority to Serial No. DE 10 2010 062 856.5, filed on Dec. 10, 2010 in Germany, the disclosures of which are incorporated herein by reference in their entirety.

The present disclosure relates to a method of ascertaining operating parameters of a battery, to a battery management system and to a battery.

BACKGROUND

In hybrid vehicles and electric vehicles, battery packs are used which feature lithium-ion or nickel-metal-hybrid technology and are composed of a large number of electrochemical cells which are connected in series. A control unit, also referred to as a battery management system, serves to monitor the battery and is intended to ensure a service life which is as long as possible, as well as monitoring the safety. For this purpose it is known to measure the voltage of each individual battery cell, the battery current and the battery temperature and to carry out estimations of states, for example of the state of charge (SOC) and/or the state of health (SOH).

In order to maximize the service life of the battery, it is necessary to know the current maximum state of function of the battery or the permissible operating range at all times. The permissible operating range of the electrochemical accumulators which are used can be represented, for example, by a multi-dimensional space which is formed by different state variables such as, for example, the temperature, the state of charge and the current strength. If the battery is operated at an operating point (for example temperature, state of charge and current strength) outside the permissible operating range, that is to say the performance limit of the battery is exceeded, the ageing of the battery can be unintentionally speeded up.

Electrochemical energy accumulators are optimized with respect to their power density and energy density for the respective use, that is to say the operating range is adapted in terms of size and position to the requirements or the field of use of the battery. It is therefore possible to assume that, in the peripheral areas of the operating range, the energy accumulator also actually runs up against its power limits, with the result that precise knowledge of the currently permissible operating range, that is to say of the maximum state of function, is extremely important. The electrochemical energy accumulators generally have a highly non-linear behavior at the boundaries of the operating range.

In order to determine the permissible operating range or the power values and energy values of an electrochemical accumulator as a function of the operating point, it is known to store data, which correspond to the operating range and which relate, for example, to the temperature, the state of charge and the current strength, in multi-dimensional tables. In this method, the measured data of the current operating point (voltage of battery cell, current and temperature of the battery) is compared with the data of the multi-dimensional tables and the permissible operating range of the relevant parameters is determined therefrom. However, this requires previous measurement of the corresponding properties of a structurally identical battery and requires low production variation. However, if significant production variation is present and if the electrochemical energy accumulator changes its properties in the course of time, this method becomes increasingly inaccurate.

In order to address the specified problem it is also known to examine individual battery cells or a representative selection of battery cells, by using a mathematical model not only with respect to their state of charge (SOC) but also with respect to ageing-specific parameters such as the state of health (SOH) and also to influence them by using a technical control structure, insofar as the permissible operating range does not permit the desired requirements of the battery to be met. A corresponding arrangement is illustrated schematically in FIG. 1. In said figure, the voltage $V_{Batt}$ of the battery cell 10, the battery current $I_{Batt}$ and the battery temperature $T_{Batt}$ are measured and an estimation of the state of charge SOC and the state of health SOH of the battery cell 10 is made by using a mathematical model. The processing of the measured values $V_{Batt}$, $I_{Batt}$, $T_{Batt}$ and SOC and SOH are determined by using the means 14 for determining current operating parameters. The means 14 for determining current operating parameters can be formed, for example, by a microcontroller or some other data processing device, and said means 14 comprises part of the battery management system 12. The operating parameters SOC and SOH which are determined by the means 14 are transmitted to the means 16 for determining or predicting the permissible operating range of the battery cell 10. The means 16 for determining the permissible operating range can also be formed by a microcontroller or some other data processing device and said means also comprises part of the battery management system 12. The means 16 can use the determined cell-specific parameters SOC and SOH to make a model-based prediction of the power parameters (that is to say of the permissible operating conditions). Furthermore the permissible operating conditions which are determined by the means 16 can be compared with the actually expected requirements which are to be made of the battery and which are supplied by the means 18 for predicting requested operating parameters of the battery 10. On the basis of the requested operating properties and the permissible operating conditions it is possible to generate parameters for the actual operation of the battery within the permissible operating conditions, for example the discharge power P, the energy E which can be extracted and the state of function, also referred to as "state of function" (SOF). These parameters then control the operating point of the battery 10.

In this context, the means 14 and 16 preferably use the same mathematical model with identical parameters SOC and SOH. As a result, it is possible to dispense with previously measured and ascertained performance tables. The behavior of electrochemical energy accumulators can be considered in a simplified fashion as being linear in parts of the operating range and therefore be modeled by means of linear models. Linear mathematical models for determining operating parameters are, for example, the Shepherd model, the Unnewehr model or the method known from DE 602 03 171 T2.

In those parts of the operating range, generally in the peripheral zones, in which the behavior is non-linear, a model for describing the behavior can only be found with great effort. Such models are generally distinguished by a high level of complexity and a large number of parameters. Non-linear mathematical models for determining operating parameters are, for example, the Nernst model or the Plett model.

DISCLOSURE OF THE INVENTION

The disclosure serves to improve the prediction of performance data of batteries, in particular the permissible operating range of operating parameters of a battery, which, according to methods known from the prior art, are subject to limitations and inaccuracies, in particular as a result of production variation and ageing.

The method according to the disclosure for ascertaining operating parameters of a battery comprises the following steps:

measuring operating parameters of the battery, determining further relevant operating parameters of the battery from the measured operating parameters, comparing at least one of the determined operating parameters with a predefined comparison interval, determining a permissible operating range of the at least one operating parameter on the basis of a mathematical battery model insofar as the at least one operating parameter lies within the predefined comparison interval, or determining a permissible operating range of the at least one operating parameter on the basis of stored battery data insofar as the at least one operating parameter is outside the predefined comparison interval.

The method according to the disclosure provides the advantage that within the predefined comparison interval it is possible to use a preferably linear mathematical battery model with a low level of complexity and few free parameters, while in the non-linear operating range of the battery, which is outside the predefined comparison interval, recourse is made to stored battery data which provide a relatively high level of accuracy for predicting the performance data. This is advantageous, in particular, since the (linear) mathematical battery model can take into account better both production variation and ageing phenomena of batteries in the linear operating range.

The advantages are a precise prediction of all the relevant performance data such as, for example, the charging and discharging performance, available energy, energy which can be extracted, voltage limits, temperature limits, current limits, customer-specific functions and/or characteristic values even in the peripheral zones of the operating range as well as tracking of the ageing of the performance data while also taking into account production variation.

The method according to the disclosure is based on observing the electrochemical energy accumulator by using a linear model in the parts of the operating range in which the energy accumulator exhibits a linear behavior or substantially linear behavior. In contrast, in the non-linear parts of the operating range the parameters of this model are not adapted by using the battery model.

The determination of a permissible operating range of the at least one operating parameter is preferably repeated within a predefined time interval. In one preferred embodiment variant, the permissible operating parameters are repeated within a time interval of less than 10 min, preferably less than 1 min, more preferably less than 10 s and even more preferably less than 1 s. This ensures that a continuous prediction of the permissible operating range of all the relevant operating parameters is made. As a result it is possible to ensure that the performance limit of the battery is not exceeded and accordingly the ageing of the battery is not undesirably speeded up.

The mathematical battery model is preferably a linear mathematical battery model.

A comparison of the determined permissible operating range of the at least one operating parameter with a future operations request profile (aimed at the battery) is preferably made. In other words a comparison is made to determine whether the requested operating point (also working point) of the battery lies within the continuously determined permissible operating range. If this is the case, the battery can be operated according to the operations request profile, that is to say at the requested operating point. In contrast, if the comparison reveals that the requested operating point lies outside the currently determined permissible operating range there is provision that the battery is not operated according to the operations request profile, that is to say at the requested operating point, but rather within the permissible operating range. The battery is preferably operated at that limiting value of the permissible operating range (power, form of energy, temperature, . . . ) which is closest to the operating point of the operations request profile.

The limits of the linear partial range (that is to say of the predefined comparison interval) can be permanently predefined. However, the predefined comparison interval is preferably determined on the basis of the measured operating parameters. In one preferred embodiment variable of the method, these limits (of the predefined comparison interval) can be determined and adapted by suitable algorithms during operation.

Tables, the so-called stored battery data, for describing and predicting the method are preferably ascertained over the entire operating range, the linear and the non-linear part (possibly empirically) and stored. Instead of storing the empirical behavior data, acquired by measurement, in tables, it is also possible to select mathematical descriptions of the behavior as a function of the operating parameters.

Reconciliation is preferably carried out between the stored battery data and the mathematical battery model.

This reconciliation can be performed, for example, on the basis of suitable reference points in the operating range. In this context, it is possible, for example, to adapt the empirical data by using suitable weighting factors to the properties which are ascertained in a model-based fashion.

In one preferred embodiment variant there is provision that the stored battery data (in the nonlinear partial range) in order to modify ageing of the battery cells which is ascertained by using the mathematical battery model. Furthermore, it is preferred to take into account the ageing ascertained by means of the mathematical battery model by using weighting factors during the modification of the stored battery data. The weighting factors are preferably determined on the basis of the absolute value of the difference between stored operating parameters and operating parameters which are ascertained by using the mathematical battery model.

The influence of production variation and the ageing of the energy accumulator can be taken into account by reconciling the predicted behavior on the basis of the stored battery data and on the basis of the mathematical battery model.

In one preferred variation of the method, in the event of the embodiment of the non-linear behavior also depending on ageing and/or variation it is possible to provide one or more further scaling factors which describe this embodiment of non-linearity and which are adjusted by means of suitable observation methods. The stored battery data, which are used to determine the permissible operating range of the at least one operating parameter in the non-linear range, are then modified in accordance with the results of the observation of the ageing and/or variation, that is to say by means of the scaling factors.

Furthermore, a battery management system is disclosed, comprising means for measuring operating parameters of the battery, means for determining further operating parameters of the battery from the measured operating parameters, a memory in which (preferably empirically determined) battery data of a battery are stored over the operating range; wherein the battery management system is designed to compare at least one of the determined operating parameters with a predefined comparison interval, and wherein the permissible operating range of the at least one operating parameter is determined on the basis of a mathematical battery model insofar as the at least one operating parameter lies within the predefined comparison interval or the permissible operating range of the at least one operating parameter is determined on the basis of stored battery data insofar as the at least one operating parameter lies outside the predefined comparison interval.

Furthermore, a battery, preferably a lithium-ion battery, is disclosed with the battery management system according to the disclosure. The battery according to the disclosure is designed, in particular, to carry out the method according to the disclosure.

Furthermore, a motor vehicle with the battery according to the disclosure is disclosed, wherein the battery is preferably connected to a drive system of the motor vehicle.

Further advantageous developments of the disclosure are specified in the dependent claims and described in the description.

BRIEF DESCRIPTION OF THE DRAWINGS

Exemplary embodiments of the disclosure are explained in more detail on the basis of the drawings and the following description, in said drawings.

DETAILED DESCRIPTION

Figure 1:
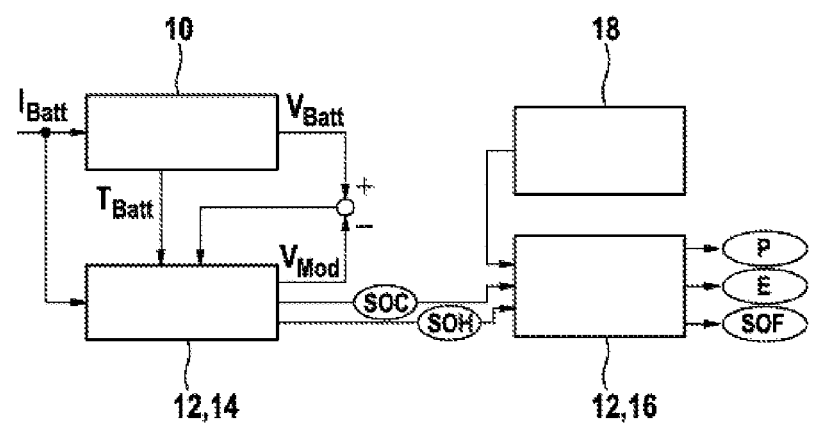
FIG. 1 shows a conventional battery management system according to the prior art.
Figure 2:
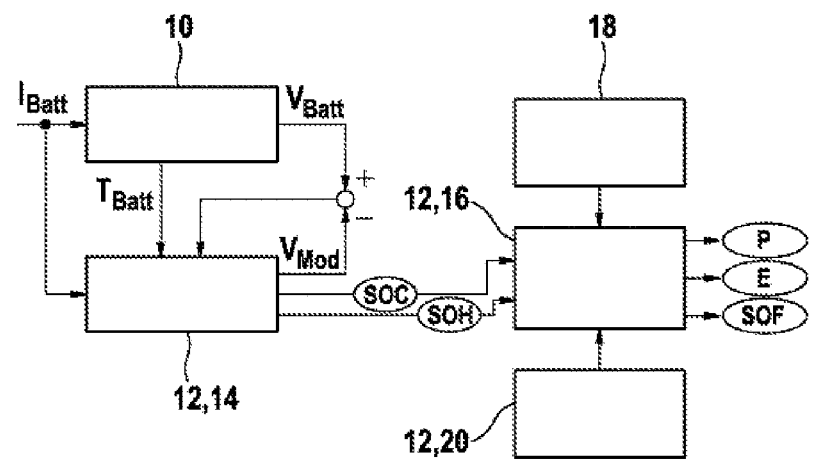
FIG. 2 shows a battery management system according to the disclosure.

FIG. 2 shows a battery management system 12 according to the disclosure. The battery management system 12 has means for measuring operating parameters, for example the battery voltage $V_{Batt}$, the battery current $I_{Batt}$ and the temperature $T_{Batt}$ of the battery 10. The battery voltage $V_{Batt}$ is measured in the present exemplary embodiment by means of a comparison voltage $V_{MOD}$. Furthermore, a means 14 is provided for determining current operating parameters such as the SOC and the SOH. The determined operating parameters SOC and SOH are transmitted to the means 16 of predicting the permissible operating range of the battery 10. The battery management system 12 also has a memory 20 in which the permissible operating range of the operating parameters (for example voltage, temperature, current, discharging power, energy which can be extracted . . . ) of the battery 10 used is represented by means of a multi-dimensional space or in multi-dimensional tables. Permissible operating ranges for different state variables such as, for example, the temperature, SOC, SOH and current strength are therefore stored in the memory 20, in each case as a function of the other operating parameters. Furthermore, there is a means 18 for predicting requested operating properties of the battery 10. The battery management system 12 according to the disclosure is designed to generate a prediction about the permissible operating range of the relevant operating parameters (for example discharging power or energy which can be extracted) on the basis of the ascertained operating parameters such as SOC and SOH. According to the disclosure, the operating parameters are determined within a predefined comparison interval, in which the behavior of the battery 10 can be considered, in a simplified form, to be linear, on the basis of a mathematical battery model, whereas the operating parameters in the non-linear operating range, which is located outside a predefined comparison interval, are determined using stored battery data of the memory 20. In other words, the means 16 for predicting the permissible operating range of the battery 10 is designed to determine the permissible operating range of the respective relevant operating parameters on the basis of a mathematical battery model insofar as these operating parameters are in a range in which the preferably linear mathematical battery model has a high level of accuracy, in particular because ageing and production variation can be taken into account. Furthermore, the means 16 for predicting the permissible operating range for the battery 10 are designed to determine the permissible operating range of the respective relevant operating parameters such as battery data which are stored in the memory 20 insofar as these operating parameters are in a range in which the mathematical battery model would have a low level of accuracy owing to the non-linear behavior of the battery 10 which is to be assumed.

After the permissible operating parameters have been determined, a comparison is made between the requirements which are actually made for the battery 10 and the permissible operating range (sum of the permissible operating parameters), wherein the requirements which are actually made are transferred by the means 18 for predicting the requested operating parameters of the battery 10. Insofar as the requirements which are actually made in terms of the individual operating parameters lie within the predetermined permissible range the battery 10 can be operated according to the requirements which are actually made as said battery does not run against its power limits. In contrast, if the comparison reveals that the requested operating point lies outside the currently determined permissible operating range there is provision that the battery 10 is not operated according to the operations request profile, that is to say at the requested operating point, but instead within the previously determined permissible operating range. The battery 10 is preferably operated at the limiting value of the permissible operating range which comes closest to the operating point of the operations request profile. The corresponding performance parameters for the battery 10, such as, for example, Power P, Energy E and State of Function SOF, are then correspondingly modified.

Figure 3:
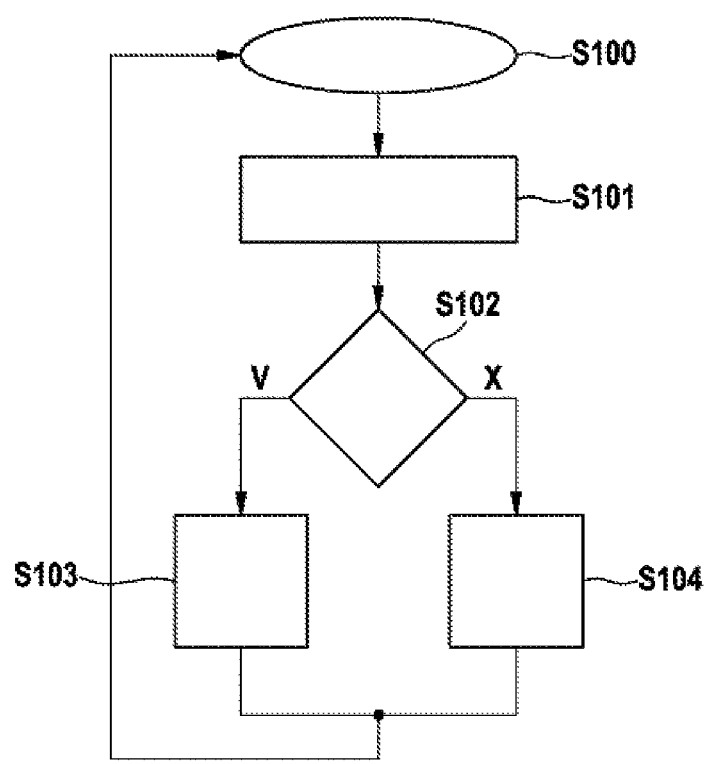
FIG. 3 shows a block diagram for determining the permissible operating range of operating parameters according to a first embodiment variant of the method according to the disclosure.

FIG. 3 shows a block diagram for determining the permissible operating range of operating parameters according to a first embodiment variant of the method according to the disclosure.

Firstly, operating parameters, for example the battery voltage $V_{Batt}$, the battery current $I_{Batt}$ and the temperature $T_{Batt}$ of the battery 10 are measured in the method step S100. As a rule, the battery is a lithium-ion battery in which a multiplicity of battery cells are connected in series and/or in parallel. In such a case, the voltage of each individual battery cell is regularly measured.

In the method step S101, the relevant operating parameters such as SOC and SOH of the battery 10 are subsequently determined from the measured operating parameters $V_{Batt}$, $I_{Batt}$, $T_{Batt}$. Further relevant operating parameters are, for example, the charging power and discharging power, available energy, energy which can be extracted, voltage limits, temperature limits, current limits and other customer-specific functions and/or characteristic values.

In order to avoid excessive ageing of the battery 10, it is necessary to continuously determine the permissible operating range of the relevant operating parameters, that is to say the performance limits, outside which the battery 10 is not to be operated.

In order to be able to make a simple and at the same time reliable prediction about the permissible operating range of the relevant operating parameters according to the disclosure, firstly in method step S102 it is investigated whether the operating parameters which are determined in the method step S101 are within a predefined comparison interval in which the behavior of the battery 10 can be considered, in a simplified fashion, to be linear.

If this is the case, the permissible operating range of the relevant operating parameters is determined in method step S103 on the basis of a linear mathematical battery model. However, if at least one of the relevant operating parameters is outside the predefined comparison interval, and it must correspondingly be assumed that the behavior of the battery 10 cannot be considered, in a simplified fashion, to be linear, the permissible operating range of the relevant operating parameters is determined in method step S104 on the basis of battery data stored in advance in the memory 20.

It is, in particular, advantageous to dispense with the use of a complex, non-linear mathematical battery model for this range outside the predefined comparison interval and to have recourse to corresponding tables (that is to say stored battery data).

Figure 4:
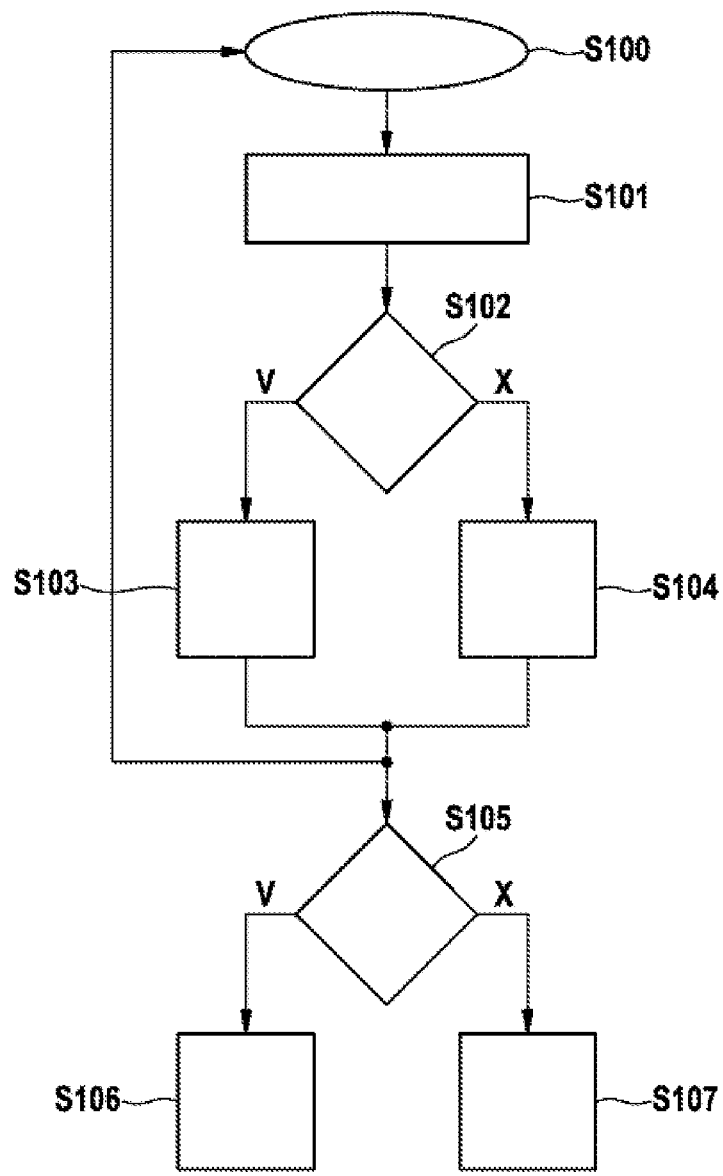
FIG. 4 shows a block diagram for determining the permissible operating range of operating parameters according to a second embodiment variant of the method according to the disclosure.

FIG. 4 shows a block diagram for determining the permissible operating range of operating parameters according to a second embodiment variant of the method according to the disclosure, which variant constitutes a development of the method shown in FIG. 3.

The permissible operating ranges, determined according to the method in FIG. 3, of the relevant operating parameters, such as, for example the charging power and discharging power, available energy, energy which can be extracted, voltage limits, temperature limits and current limits, can then be compared in method step S105 with the requirements which are actually made of the battery 10.

Insofar as the requirements which are actually made of the individual operating parameters lie within the previously determined permissible ranges, in method step S106 the battery 10 can be operated according to the requirements which are actually made as said battery does not run up against its performance limits. If, on the other hand, the comparison reveals that the requested operating point lies outside the currently determined permissible operating range, there is provision that the battery 10 is not operated according to the operations request profile which is actually made, that is to say at the requested operating point, but rather within the previously determined permissible operating range in method step S107.

Figure 5:
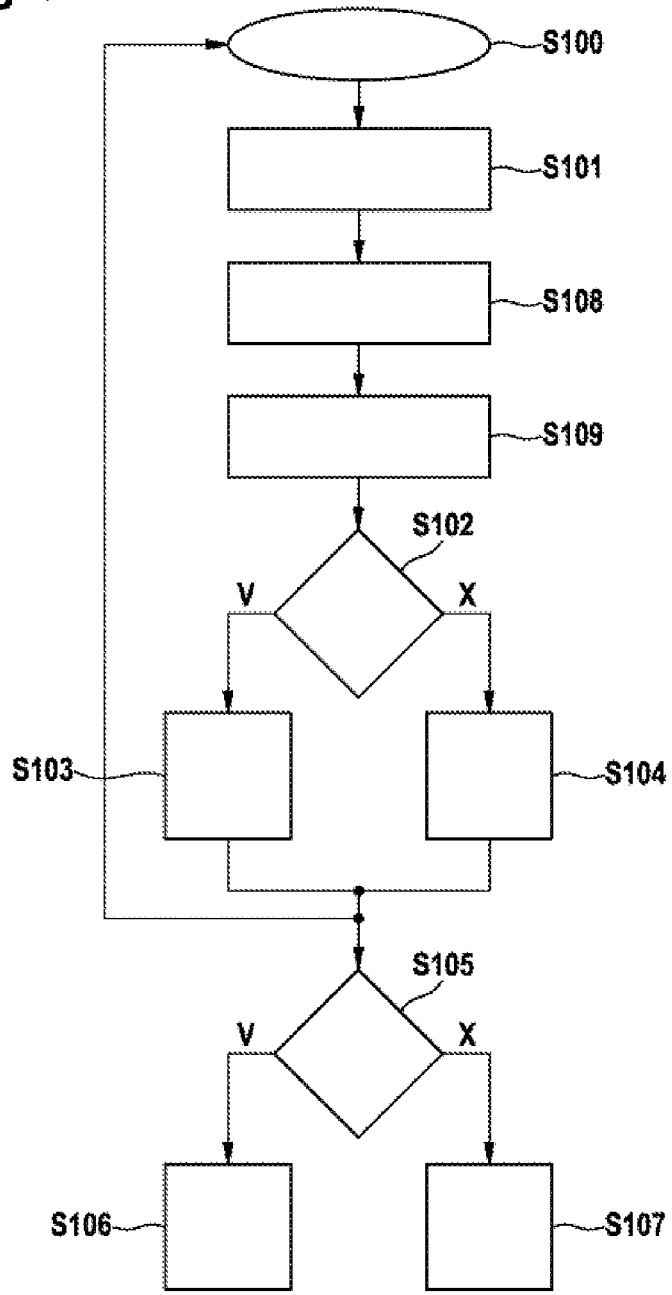
FIG. 5 shows a block diagram for determining the permissible operating range of operating parameters according to a third embodiment variant of the method according to the disclosure.

FIG. 5 shows a block diagram for determining the permissible operating range of operating parameters according to a third embodiment variant of the method according to the disclosure, which variant constitutes a development of the method shown in FIG. 4.

In order to increase further the accuracy of the method according to the disclosure, there is provision that the limits of the linear partial range (that is to say of the predefined comparison interval) in method step S108 are determined on the basis of the measured operating parameters $V_{Batt}$, $I_{Batt}$, $T_{Batt}$ or the parameters such as SOC and SOH which are ascertained therefrom. It is preferred here that these limits are adapted by suitable algorithms during operation. Such dynamic adaptation of the limits is, for example, advantageous since the permissible operating ranges of the relevant operating parameters of the battery 10 can change in the course of time, as a result of which the partial range in which the method of the battery 10 can be considered to be linear also changes. If, for example, the linear partial range of the upper temperature limit decreases, adaptation of the limits will lead to a situation in which even at relatively low temperatures, recourse is made to the data (S104) stored in the memory 20 instead of to the mathematical battery model (S103), wherein in such a case the stored data will have a higher level of accuracy than the mathematical battery model since the range in which the behavior of the battery 10 has to be considered as non-linear will have become larger in the course of time.

In order to increase further the accuracy of the method according to the disclosure, there is provision that in method step S109 reconciliation is carried out between the battery data stored in the memory 20 and the permissible operating ranges (determined by the mathematical battery model) of the relevant operating parameters.

This reconciliation can be performed, for example, on the basis of suitable reference points in the operating range. In this context it is possible, for example, to use suitable weighting factors to adapt the empirical data to the properties which are ascertained in a model-based fashion.

The invention claimed is:

1. A method for ascertaining operating parameters of a battery, comprising:
    measuring a plurality of measured operating parameters of the battery;
    determining a plurality of determined operating parameters of the battery from the plurality of measured operating parameters;
    comparing at least one determined operating parameter of the plurality of determined operating parameters with a predefined range for the at least one determined operating parameter;
    determining a permissible operating range of the at least one determined operating parameter based on a mathematical battery model if the at least one determined operating parameter lies within the predefined range for the at least one determined operating parameter; and
    determining the permissible operating range of the at least one determined operating parameter based on stored battery data if the at least one determined operating parameter is outside the predefined range for the at least one determined operating parameter.

2. The method as claimed in claim 1, wherein the determination of the permissible operating range of the at least one determined operating parameter is repeated within a predefined time interval.

3. The method as claimed in claim 1, wherein the mathematical battery model is a linear mathematical battery model.

4. The method as claimed in claim 1, further comprising:
    comparing the permissible operating range of the at least one determined operating parameter with an operations request profile;

operating the battery according to the operations request profile if the at least one determined operating parameter of the operations request profile lies within the permissible operating range; and operating the battery according to a limiting value of the permissible operating range if the at least one determined operating parameter of the operations request profile lies outside the permissible operating range.

5. The method as claimed in claim 1, wherein the predefined range is determined on the basis of the plurality of measured operating parameters.

6. The method as claimed in claim 1, further comprising:
reconciling between the stored battery data and the mathematical battery model.

7. The method as claimed in claim 1, wherein the plurality of determined operating parameters includes at least one of a state of charge, a state of health, a state of function, an upper voltage limit, a lower voltage limit, an upper temperature limit, a lower temperature limit, an upper current limit, a lower current limit, a charging power, a discharging power, an available energy, and an energy configured to be extracted from the battery.

\* \* \* \* \*